(12) United States Patent
Huang et al.

(10) Patent No.: US 9,583,367 B2
(45) Date of Patent: Feb. 28, 2017

(54) METHODS AND APPARATUS FOR BUMP-ON-TRACE CHIP PACKAGING

(71) Applicant: Taiwan Semiconductor Manufacturing Company, Ltd., Hsin-Chu (TW)

(72) Inventors: Chang-Chia Huang, Hsin-Chu (TW); Chen-Shien Chen, Zhubei (TW); Sheng-Yu Wu, Hsin-Chu (TW); Tin-Hao Kuo, Hsin-Chi (TW); Yen-Liang Lin, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/883,375

(22) Filed: Oct. 14, 2015

(65) Prior Publication Data

US 2016/0035591 A1    Feb. 4, 2016

Related U.S. Application Data

(60) Division of application No. 14/459,047, filed on Aug. 13, 2014, now Pat. No. 9,165,796, which is a
(Continued)

(51) Int. Cl.
*H01L 21/56* (2006.01)
*H01L 23/31* (2006.01)
(Continued)

(52) U.S. Cl.
CPC ........ *H01L 21/563* (2013.01); *H01L 23/3157* (2013.01); *H01L 23/49816* (2013.01); *H01L 24/32* (2013.01); *H01L 24/81* (2013.01); *H01L 24/13* (2013.01); *H01L 24/16* (2013.01); *H01L 24/29* (2013.01); *H01L 2224/13082* (2013.01); *H01L 2224/13111* (2013.01); *H01L 2224/13139* (2013.01); *H01L 2224/13147* (2013.01); *H01L 2224/16237* (2013.01); *H01L 2224/16238* (2013.01); *H01L 2224/26175* (2013.01); *H01L 2224/2929* (2013.01);
(Continued)

(58) Field of Classification Search
CPC ............... H01L 21/563; H01L 23/3157; H01L 23/49816; H01L 24/32; H01L 24/81
USPC .................. 257/734, 767, 778; 438/612, 614
See application file for complete search history.

(56) References Cited

U.S. PATENT DOCUMENTS

5,647,123 A    7/1997   Greenwood et al.
7,135,765 B2   11/2006  Venkateswaran
(Continued)

*Primary Examiner* — Errol Fernandes
(74) *Attorney, Agent, or Firm* — Slater Matsil, LLP (57) ABSTRACT

Methods and apparatuses for a attaching a first substrate to a second substrate are provided. In some embodiments, a first substrate has a protective layer, such as a solder mask, around a die attach area, at which a second substrate is attached. A keep-out region (e.g., an area between the second substrate and the protective layer) is a region around the second substrate in which the protective layer is not formed or removed. The keep-out region is sized such that a sufficient gap exists between the second substrate and the protective layer to place an underfill between the first substrate and the second substrate while reducing or preventing voids and while allowing traces in the keep-out region to be covered by the underfill.

20 Claims, 8 Drawing Sheets

Related U.S. Application Data continuation-in-part of application No. 13/450,191, filed on Apr. 18, 2012, now abandoned.

(51) Int. Cl.
  *H01L 23/00* (2006.01)
  *H01L 23/498* (2006.01)

(52) U.S. Cl.
  CPC ............ *H01L 2224/29386* (2013.01); *H01L 2224/321* (2013.01); *H01L 2224/32225* (2013.01); *H01L 2224/73204* (2013.01); *H01L 2224/81024* (2013.01); *H01L 2224/81191* (2013.01); *H01L 2224/81815* (2013.01); *H01L 2224/83102* (2013.01); *H01L 2924/15311* (2013.01); *H01L 2924/35121* (2013.01); *H01L 2924/37001* (2013.01)

(56) References Cited

U.S. PATENT DOCUMENTS

| | | |
|---|---|---|
| 2002/0180027 A1* | 12/2002 | Yamaguchi ........... H01L 21/486 257/700 |
| 2004/0164414 A1 | 8/2004 | Venkateswaran |
| 2006/0033210 A1 | 2/2006 | Chauhan et al. |
| 2007/0096336 A1 | 5/2007 | Lee et al. |
| 2007/0166993 A1 | 7/2007 | Lee et al. |
| 2009/0236756 A1 | 9/2009 | Kim et al. |
| 2013/0099371 A1 | 4/2013 | Cheng et al. |

* cited by examiner

METHODS AND APPARATUS FOR BUMP-ON-TRACE CHIP PACKAGING

PRIORITY CLAIM AND CROSS-REFERENCE

This application is divisional application of U.S. patent application Ser. No. 14/459,047, entitled "Methods and Apparatus for Bump-on-Trace Chip Packaging," filed on Aug. 13, 2014, which is a continuation-in-part of U.S. patent application Ser. No. 13/450,191, entitled "Methods and Apparatus for Bump-on-Trace Chip Packaging," filed on Apr. 18, 2012, which applications are incorporated herein by reference.

BACKGROUND

Integrated circuits or chips are made up of millions of active and passive devices such as transistors and capacitors. These devices are initially isolated from each other, and are later interconnected to form integrated circuits. Connector structures are further formed for integrated circuits, which may include bond pads or metal bumps formed on the surface of the circuits. Electrical connections are made through the bond pads or metal bumps to connect the chip to a package substrate or another die. In general, chips may be assembled into a package such as a pin grid array (PGA), or ball grid array (BGA), using wire bonding (WB) or flip chip (FC) packaging technology.

A flip-chip (FC) packaging technology may connect a chip to a package substrate using a bump-on-trace (BOT) structure, wherein the connections are made through the metal bumps to connect the chip to the metal traces of the package substrate or die. The BOT structure offers a low cost alternative to microelectronic packaging industry. However, the reliability issues for BOT structure rises as substrate structure goes thinner.

When using a BOT structure, bumps for the chip are soldered onto the trace on the package substrate by a reflow process. When the bumps are joined to the substrate and cooled down from the reflow condition to a room temperature, thermal force caused by coefficient of thermal expansion (CTE) mismatch drives the substrate shrinkage and leads to relative twist on each bump. Once stress level rises over the adhesive criteria between the substrate and the trace, a trace peeling failure occurs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-6B illustrate various plan and cross-sectional views of intermediate process steps in accordance with some embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As will be illustrated in the following, methods and apparatus for a solder mask trench used in a BOT structure to form a semiconductor package are disclosed. A solder mask layer is formed on a trace and on a substrate. An opening of the solder mask layer, called a solder mask trench, is formed to expose the trace on the substrate. A chip is connected to the trace exposed in the solder mask trench. With the formation of the solder mask trench, the trace exposed in the trench can have a better grab force, which reduces the trace peeling failure for the semiconductor package.

Figure 1:
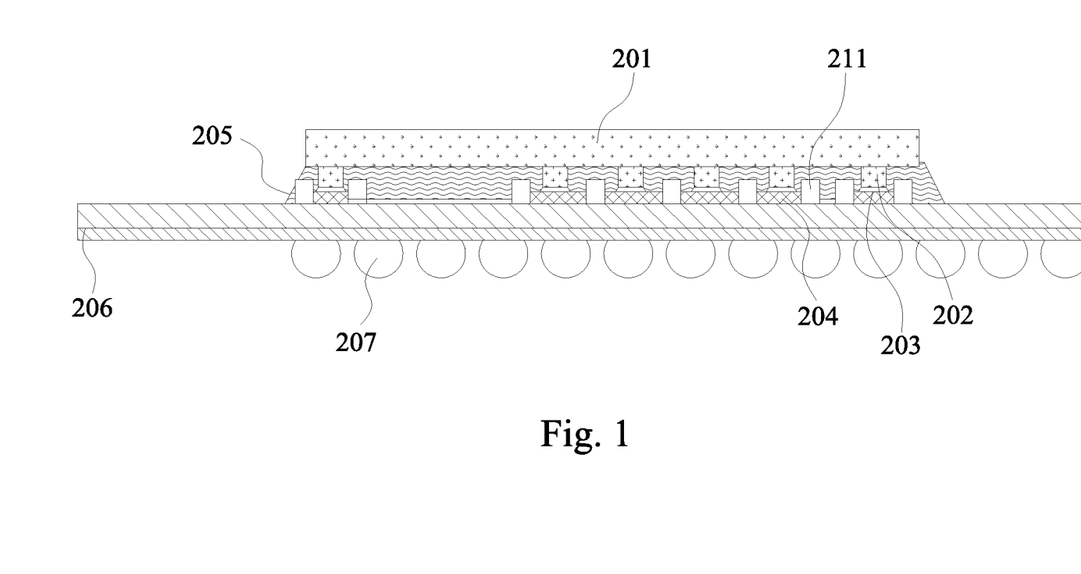
FIG. 1 illustrates an embodiment of a chip on a bump-on-trace (BOT) structure to form a flip-chip (FC) package.

FIG. 1 is a schematic view of an illustrative embodiment of a chip 201 on a bump-on-trace (BOT) structure to form a flip-chip (FC) package. A substrate 206 may have a plurality of sub-layers. The two sub-layers of substrate 206 shown in FIG. 1 are only for illustrative purpose and are not limiting. A plurality of balls 207 under the substrate 206 may form a ball grid array (BGA). A chip 201 is connected to the substrate 206 by a plurality of interconnects wherein each interconnect comprises a Cu pillar bump or a post 202 and a solder bump 203. The solder bump 203 is placed on a trace 204 which is formed on the substrate 206. A solder mask 211 is formed on the surface of the substrate 206 covering the trace. An opening of the solder mask is formed, called a solder mask trench, which exposes the trace 204. The space between the chip 201 and the substrate 206 may be filled with a compound, forming an encapsulation body 205.

Figure 2A:
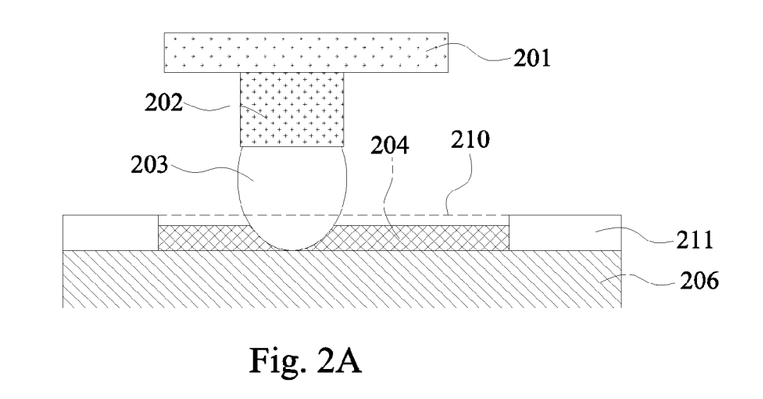
FIGS. 2(a)-(c) illustrate an embodiment of a method and an apparatus of a solder mask trench used in a BOT structure to form a FC package.

FIG. 2(a) illustrates an embodiment of a single solder mask trench 210 on a substrate 206, which may be any of the trenches in FIG. 1 where a trace is exposed and a connection to the chip 201 is made. A trace 204 is formed on the surface of the substrate 206. A solder mask layer 211 may be formed on the trace covering the trace and the surface of the substrate 206. A trench may be opened in the solder mask layer 211 to form a solder mask trench 210 to expose the trace 204. The trench has an opening big enough so that the interconnect such as the solder ball 203 may directly land on the trace contained in the opening. For example, the solder mask trench has a size about a diameter of a solder bump. The trace 204 may be connected to a chip 201 by way of an interconnect. The interconnect may comprise a solder bump 203 and a post such as a Cu pillar 202, where the solder ball 203 is placed on the trace 204 directly and surrounded by the solder mask trench. The structures shown in FIG. 2(a) are only for illustrative purpose and are not limiting. Additional embodiments can be conceived.

Figure 2B:
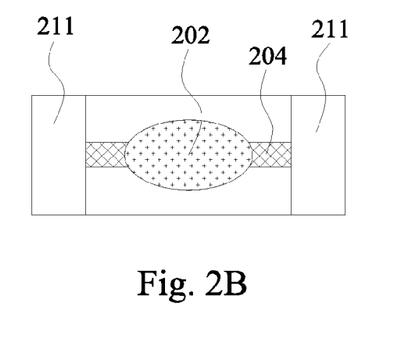

FIG. 2(b) illustrates the top view where a post 202 is on the trace 204, which is surrounded by the solder mask 211. The chip 201 and the substrate 206 are not shown in FIG. 2(b).

Figure 2C:
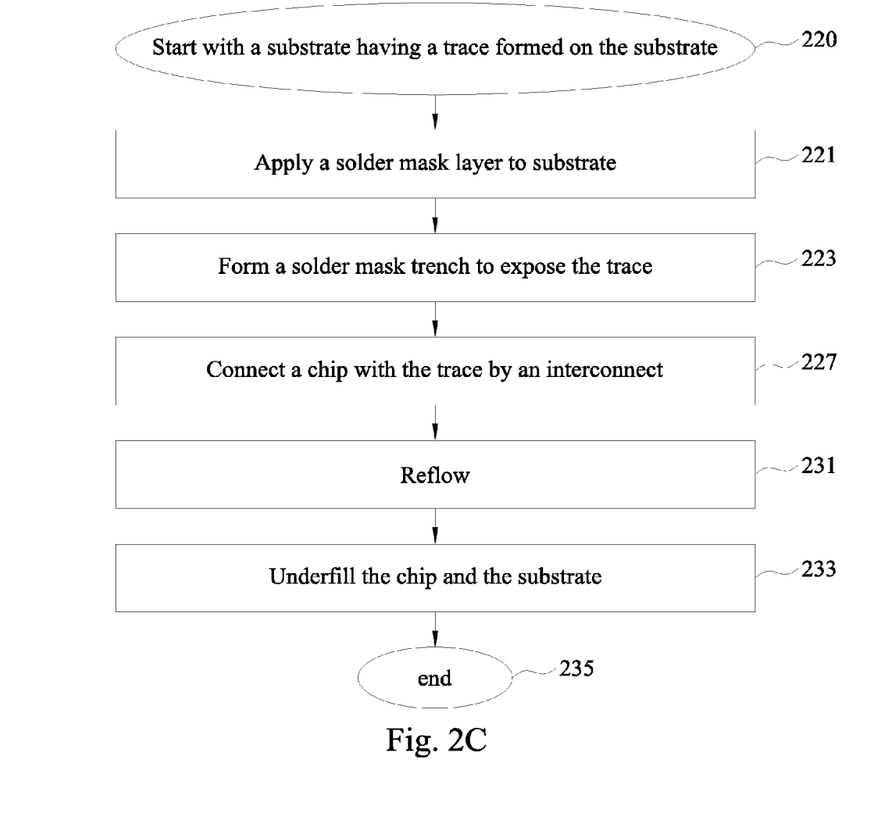

FIG. 2(c) illustrates an exemplary process of manufacturing the embodiment shown in FIG. 2(a). Details of the process shown in FIG. 2(c) are explained below.

The process starts at step 220, where a substrate such as the substrate 206 in FIG. 2(a) is provided. The substrate 206 may provide the package with the mechanical support and an interface that allows external components access to the device within the package. The substrate 206 may comprise bulk silicon, doped or undoped, or an active layer of a silicon-on-insulator (SOI) substrate. Other substrates may include multi-layered substrates, gradient substrates, or hybrid orientation substrates. The substrate 206 may further be a laminate substrate formed as a stack of multiple thin layers of a polymer material such as bismaleimide triazine, or the like.

A trace 204 may be on the surface of the substrate 206. The trace 204 may be for expanding the footprint of a die. The width or diameter of the trace may be about the same as the ball (or bump) diameter, or can be as much as two to four times narrower than the ball (or bump) diameter. For example, the trace 204 may have a line width between about 10 μm and 40 μm and trace pitch P between about 30 μm and 70 μm. The trace may have a narrow, wide, or tapered shape. The terminal of the trace may be of a different shape from the body of the trace. The trace body may be of a substantially constant thickness. The terminal of the trace and the body of the trace are formed as one piece, which is different from placing a pad on a trace. The trace may have a substantially longer length than the diameter of the ball (or bump) diameter. On the other hand, a connection pad may be of similar length or width as the ball or bump diameter.

There may be multiple traces on the substrate, each electrically insulated from one another, and the space between two adjacent traces may be between about 10 μm and 40 μm.

The trace 204 may comprise conductive materials such as Al, Cu, Au, alloys thereof, other materials, or combinations and/or multiple layers thereof, as examples. Alternatively, the trace 204 may comprise other materials. In some embodiments, a dielectric layer may cover some portions of the trace 204. The trace 204 may be covered by a metal finish, such as a layer of organic film or a mix material such as Ni/Pd/Au, coated on the trace 204.

The trace 204 and the substrate are connected by merely interfacial adhesion between them, which may not be enough grabbing force to make a strong connection between the trace 204 and the substrate 206.

At step 221, a solder mask layer such as the solder mask layer 211 shown in FIG. 2(a) may be formed on the surface of the substrate 206 covering the trace 204 and the surface of the substrate. The solder mask layer 211 may perform several functions, including providing electrical insulation resistance between the circuit traces on the substrate, chemical and corrosion resistance or protection, mechanical (scratch, wear) protection, boundaries on solder surfaces, additional grabbing force on trace, and improved dielectric reliability. The solder mask layer provides additional grabbing force between the trace 204 and the substrate 206, because the solder mask, the trace, and the substrate form a sandwich structure, where the solder mask and substrate "clib" the trace.

The solder mask layer 211 may be formed at a single step, by screening a wet film onto the substrate surface and then curing the wet film by oven baking. The thickness of the solder mask layer 211 may be about 30 to 40 microns (typically about 35 microns). The solder mask layer may comprise polymer material.

At step 223, a trench may be opened in the solder mask layer 211 to form a solder mask trench 210 to expose the trace 204, as shown in FIG. 2(a). The trench has an opening big enough so that an interconnect such as the solder ball 203 may directly land on the trace contained in the opening. A wider opening to host the solder ball can increase the connection strength between the solder ball and the trace. The size of the opening is therefore flexible and may change with the size of the solder ball used to connect to the trace. A solder mask layer 211 formed by the wet film can be screened in a pattern to form the solder mask trench 210. For example, the solder mask layer with a solder mask trench may be placed on a roller first to print on the substrate. Alternatively, a photo-sensitive material may be used to pattern the solder mask trench 210 to the cured film. The solder mask trench 210 may be formed to expose the trace 204 to further form the appropriate electrical connections with the die to be mounted on the substrate.

A solder flux (not shown) may be applied to the trace. The flux serves primarily to aid the flow of the solder, such that the solder balls 203 make good contact with traces on the substrate. It may be applied in any of a variety of methods, including brushing or spraying. The flux generally has an acidic component, which removes oxide barriers from the solder surfaces, and an adhesive quality, which helps to prevent the chip from moving on the substrate surface during the assembly process.

At step 227, a chip 201 may be connected to the trace 204 by way of an interconnect of the chip, as shown in FIG. 2(a). As illustrated in FIG. 2(a), the interconnect may comprise a solder bump 203 and a post such as a Cu pillar 202. The trench has an opening big enough so that the solder ball 203 may directly land on the trace contained in the opening.

The solder bump 203 of a chip 201 may be placed on the trace 204 exposed by the solder mask trench. The solder bump 203 may comprise a material such as tin, or other suitable materials, such as silver, lead-free tin, copper, combinations thereof, or the like. In an embodiment in which the solder bump 203 is a tin solder bump, the solder bump 203 may be formed by initially forming a layer of tin through methods such as evaporation, electroplating, printing, solder transfer, or ball placement, to a thickness of, e.g., about 15 μm, and then performing a reflow in order to shape the material into the desired bump shape. Any suitable method of producing the solder bump 203 may alternatively be utilized.

A chip such as the chip 201 shown in FIG. 2(a) may be connected to the trace 204 by the solder bump 203 and a post 202. A post 202 may be formed on the chip 201. The post 202 may be a Cu pillar or other metals with a melting temp higher than 300° C. The chip 201 may be aligned so that the post 202 is placed onto the solder bump 203. The chip may be a memory chip, or any other function chip.

The post 202 and solder bump 203 together form an interconnect of the chip. The post 202 and solder bump 203 may be formed in a plurality of shapes as appropriate to avoid nearby components, control the connection area between the chip 201 and the trace 204, or other suitable reasons. The interconnect may be in the shape of a circle, an octagon, a rectangle, an elongated hexagon with two trapezoids on opposite ends of the elongated hexagon, an oval, a diamond.

At step 231, a reflow process is performed. After the chip 201 is bond to the trace as shown in FIG. 2(a), heat may be applied to the chip 201 and the substrate 206, causing the solder balls 203 to reflow and form electrical connections between the chip 201 and the substrate 206. For one embodiment, the heat may be to a temperature of about 220 C.

At step 233, an underfill material, typically a thermo-set epoxy, may be dispensed into the gap between the chip 201 and the substrate 206. Beads of thermo-set epoxy may be applied along one edge of the chip where the epoxy is drawn under the chip by capillary action until it completely fills the gap between the chip and the substrate. It is important that the underfill material is uniformly dispersed in the gap.

A separate bead of epoxy may also be dispensed and bonded around the perimeter of the chip 201. Afterwards, both the underfill and perimeter bonding epoxy are cured by heating the substrate and chip to an appropriate curing temperature, which form an encapsulation body such as the encapsulation body 205 shown in FIG. 1. The encapsulation body 205 has filled the gap between the chip 201 and the substrate 206. In this manner the process produces a mechanically, as well as electrically, bonded semiconductor chip assembly, when the process ends.

Figure 3:
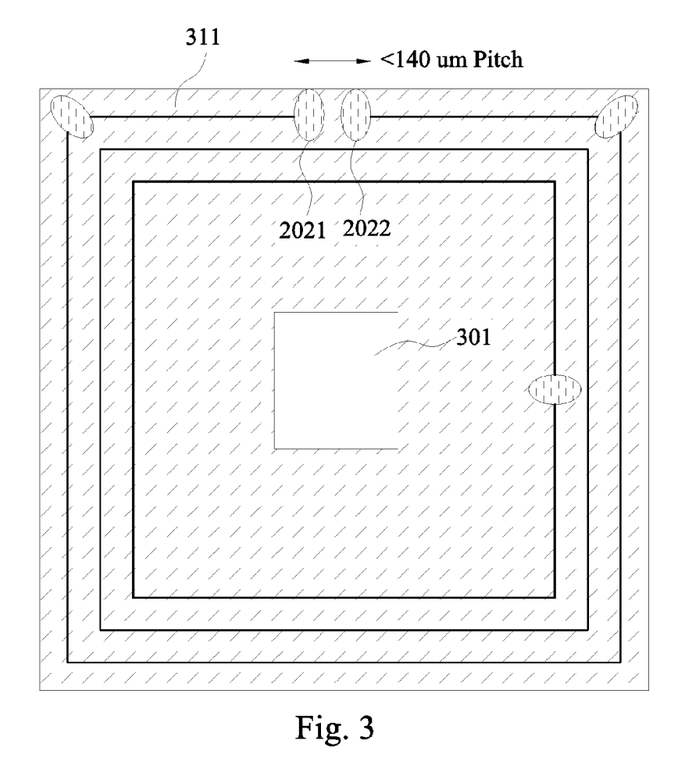
FIG. 3 illustrates a top view of a plurality of bumps connected to traces within a plurality of solder mask trench rings used in BOT structures.

FIG. 3 illustrates a top view of the substrate of a semiconductor package formed by BOT structures. The surface of the substrate may be covered by solder mask, except the area 301. The solder mask may cover the surface of the substrate in other shapes as well. There may be a plurality of solder mask trench 311 formed on the solder mask layer. The solder mask trenches surround the center area of the substrate, and form a plurality of solder mask trench rings. The shape of the solder mask trench follows the contour of the trace on the substrate. There may be other shapes instead of solder mask rings formed. There are three such solder mask trench rings formed in FIG. 3. There may be other number of solder mask trench rings formed. A plurality of posts or interconnects such as 2021 and 2022 may be placed on traces exposed within the solder mask trenches. The pitch between two posts or two interconnects may be less than about 140 um.

In other embodiments, the solder mask is removed from a die-attach area, such as an area in which a die or other substrate may be attached, and a keep-out region (e.g., a region immediately surrounding the die-attach area). As explained in greater detail below, the solder mask material will be removed such that the area directly under a die and the immediately surrounding area will be removed. The size of the area in which the solder mask material is removed is greater than a size of the die. The size of the area in which the solder mask material is removed is determined such that the lateral area between an edge of the die and the edge of the solder mask allows an underfill material to be applied in a manner that completely fills the area between the die and an underlying substrate, without leaving exposed traces.

For example, in some situations in which the lateral area between an edge of the die and the edge of the solder mask is too small, the underfill material may not completely fill the area between the die and the underlying substrate, allowing for the formation of one or more voids between the die and the underlying substrate. In other situations in which the lateral area between an edge of the die and the edge of the solder mask is too large, traces may remain exposed. It has been found that by controlling the width of the distance between the an edge of the die and the edge of the solder mask and/or controlling the ratio of the area of the region between the an edge of the die and the edge of the solder mask to the area of the die, the underfill may completely fill the area between the die and the underlying substrate and cover the traces, thereby providing protection to the electrical connections between the die and the underlying substrate and to the traces on the underlying substrate.

It should be noted that the discussion herein refers to a die attached to a substrate for illustrative purposes to explain features of various embodiments. In other embodiments, the die may be another substrate, such as a package, a packaging substrate, an interposer, a die, a printed circuit board, or the like. Similarly, the underlying substrate may be, for example, a package, a packaging substrate, an interposer, a die, a printed circuit board, or the like.

Figure 4A:
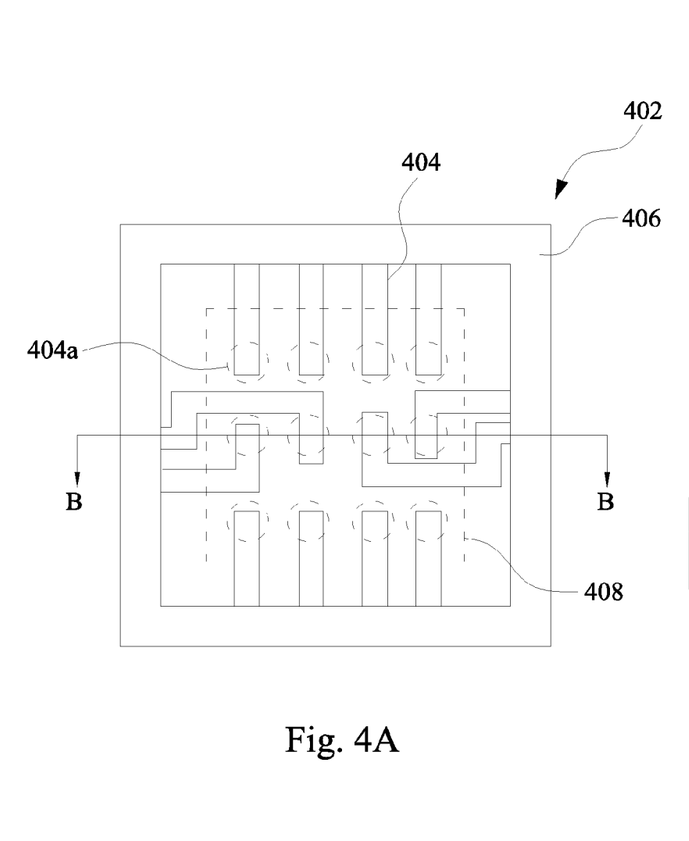

As such FIGS. 4A-6B illustrate various intermediate stages in a process of forming some embodiments, wherein the "A" figures are plan views and the "B" figures are cross-sectional views along the B-B line of the corresponding "A" figure. Referring first to FIGS. 4A and 4B there is illustrated a plan view and a cross-sectional view taken along the B-B line in FIG. 4A of a first substrate 402. The first substrate 402 may be, for example, an integrated circuit die, a packaging substrate, a wafer, a printed circuit board, an interposer, or the like. In some embodiments, a BOT configuration is used. For example, FIGS. 4A and 4B illustrate traces 404. Generally, the traces 404 route electrical signals to a desired location and/or for expanding the footprint of a die. The width or diameter of the traces 404 may be about the same as the ball (or bump) diameter, or can be as much as two to four times narrower than the ball (or bump) diameter. For example, the traces 404 may have a line width between about 10 μm and 40 μm and trace pitch P between about 30 μm and 70 μm. The trace may have a narrow, wide, or tapered shape. In some embodiments, a terminal end of the trace may be of a different shape from the body of the trace, or the trace body may be of a substantially constant thickness. The terminal end of the trace and the body of the trace are formed as one piece, which is different from placing a pad on a trace. The trace may have a substantially longer length than the diameter of the ball (or bump) diameter. On the other hand, a connection pad may be of similar length or width as the ball or bump diameter.

Figure 4B:
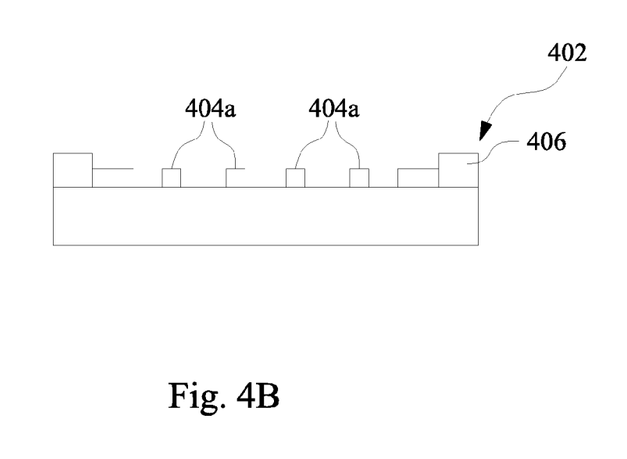

In some embodiments, the traces 404 may include conductive materials such as Al, Cu, Au, alloys thereof, other materials, or combinations and/or multiple layers thereof, as examples. Alternatively, the traces 404 may comprise other materials. The traces 204 may be covered by a metal finish, such as a layer of organic film or a mix material such as Ni/Pd/Au, coated on the traces 404. In some embodiments, a pitch between adjacent traces may be between about 10 μm and 40 μm.

FIGS. 4A and 4B further illustrate a protective layer 406. Generally, the protective layer 406 provide protection from environmental contaminants, electrical insulation resistance between the circuit traces on the substrate, chemical and corrosion resistance or protection, mechanical (scratch, wear) protection, boundaries on solder surfaces, additional grabbing force on trace and/or substrate, and improved dielectric reliability. In some embodiments, the protective layer 406 is, for example, a polymer or other dielectric material. In some embodiments, the protective layer 406 is, for example, a polymer that is formed by screening or spin coating, patterned, and subsequently cured.

The protective layer 406 covers portions of the traces 404, such as the portions of the traces in a periphery region of the first substrate 402. For example, in the embodiment illustrated in FIG. 4A, the protective layer 406 is separated from and formed around a die attach region 408, represented by a dotted outline in FIG. 4A. As discussed in greater detail below, the die attach region 408 represents a region on which another substrate will be placed. The protective layer 406 will protect the traces 404 from external environmental contaminants and is sized to allow an underfill to completely fill the area between the die and the first substrate 402 while also covering the exposed traces 404. The thickness of the protective layer 412 may be about 30 μm to about 40 μm, such as about 35 μm.

Figure 5A:
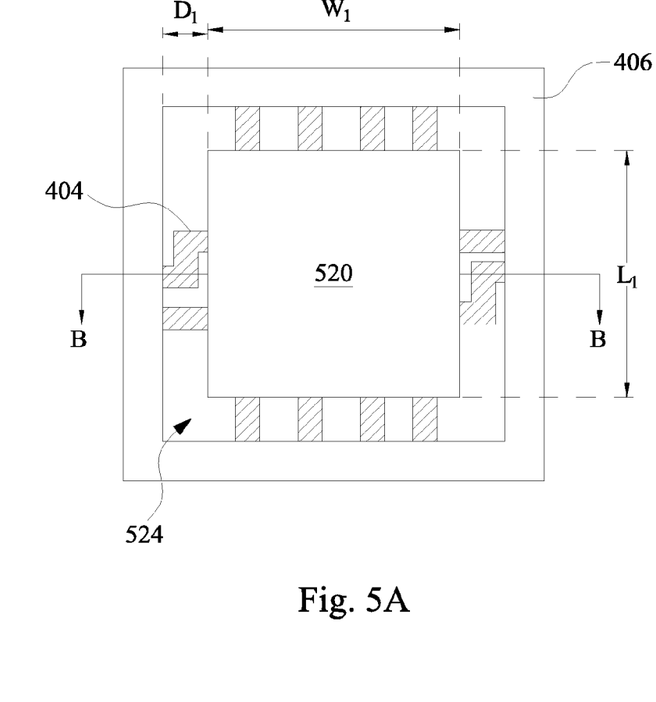
Figure 5B:
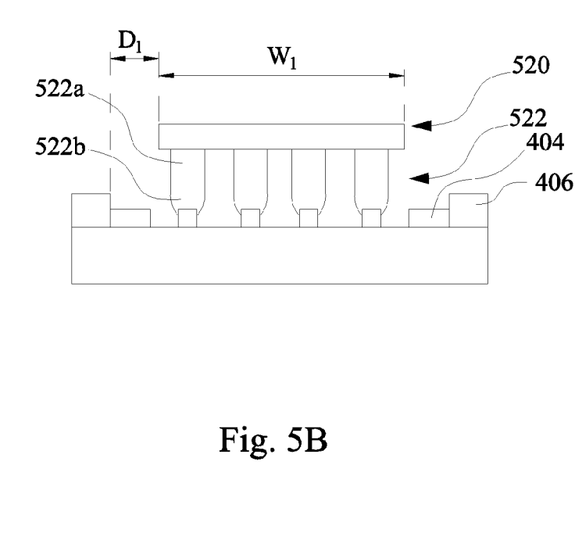

Referring now to FIGS. 5A and 5B, there is shown the first substrate 402 of FIGS. 4A and 4B after a second substrate 520 has been attached to the first substrate 402 in accordance with some embodiments. The first substrate 520 may be for example, a die, a substrate, a wafer, a packaging substrate, a printed circuit board, or the like. The second substrate 520 is electrically coupled to the first substrate by electrical connectors 522. In some embodiments, the electrical connectors 522 include a conductive pillar 522a (e.g., a copper pillar) and a solder material 522b coupled thereto, although other electrical connectors may be used.

In some embodiments, the first substrate 402 is an integrated circuit die and the second substrate 404 is a wafer, which substrates are bonded in a flip-chip chip-scale package (FCCSP). The wafer may subsequently be singulated to form separate packages. Other configurations, however, may be used.

As illustrated in FIGS. 5A and 5B, a keep-out-region (KOR) 524 extends around the second substrate 520 between the second substrate 520 and the protective layer 406. In some embodiments, the (KOR) 524 includes a region in which an interior edge of the protective layer 406 is spaced apart from an edge of the second substrate 520 by a keep-out distance (KOD) $D_1$. In some embodiments, the area of the KOR 524 is between about 5% to about 18% of the area of the second substrate 520. For example, where the area of the second substrate 520 is a width $W_1$ times a length $L_1$, a ratio of the area of the KOR 524 to the area of the second substrate 520 (e.g., width $W_1$ times length $L_1$) is between about 1:20 to about 9:50. Additionally, in some embodiments the keep-out distance $D_1$ is greater than or equal to about 420 μm.

It has been found that using these guidelines (the ratio of the KOR 524 to the area of the second substrate 520 and the minimum size of the keep-out distance), sufficient distance is provided between the edges of the protective layer 406 and the second substrate 520 to allow an underfill material to be applied such that the underfill material will be substantially void-free and cover the exposed traces in the KOR 524. As discussed above, having a smaller distance may result is poor filling abilities between the first substrate 402 and the second substrate 520, thereby creating voids, and having a larger distance may result in exposed traces in the KOR 524. Maintaining the keep-out distance and the KOR 524 as discussed above resolves these issues, preventing or reducing the occurrence of voids between the first substrate 402 and the second substrate 520 and providing better coverage of the exposed traces in the KOR 524.

Figure 6A:
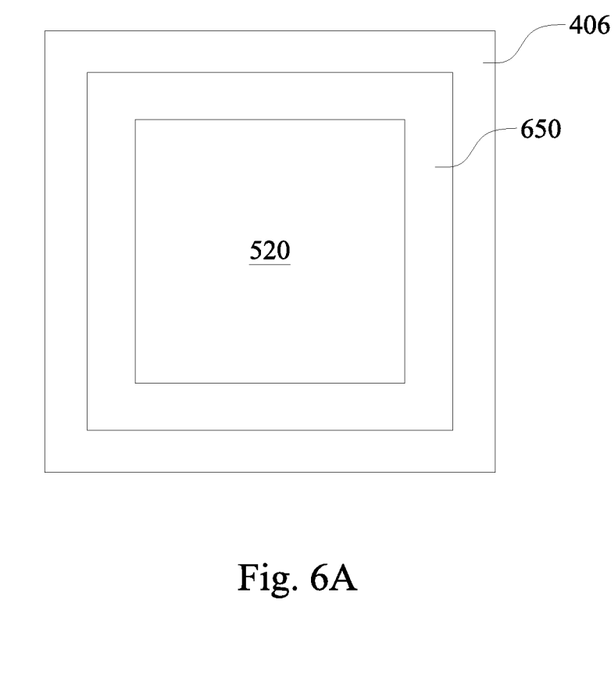
Figure 6B:
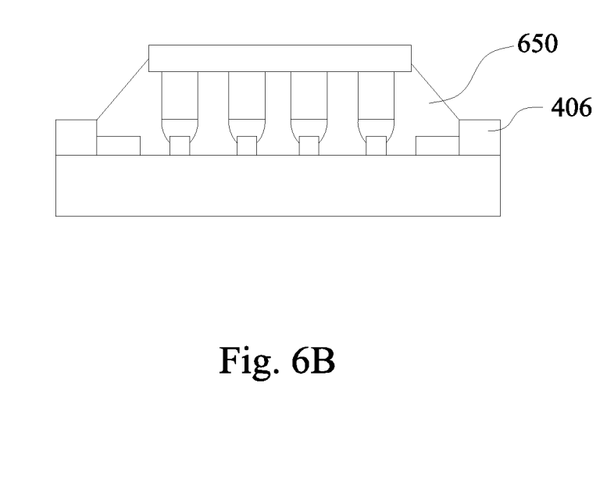

FIGS. 6A and 6B illustrate the first substrate 402 and the second substrate 520 after having an underfill 650 interposed therebetween in accordance with some embodiments. In some embodiments, the underfill 650 comprises a polymer, a thermo-set epoxy, or the like, dispensed into the gap between the second substrate 520 and the protective layer 406, e.g., the KOR 524. For example, in some embodiments the underfill material is a polymer compound having silicon dioxide filler materials. Beads of the underfill 650 may be applied along one edge of the chip where the underfill 650 is drawn under the chip by capillary action until it completely fills the gap between the first substrate 402 and the second substrate 520.

Figure 7:
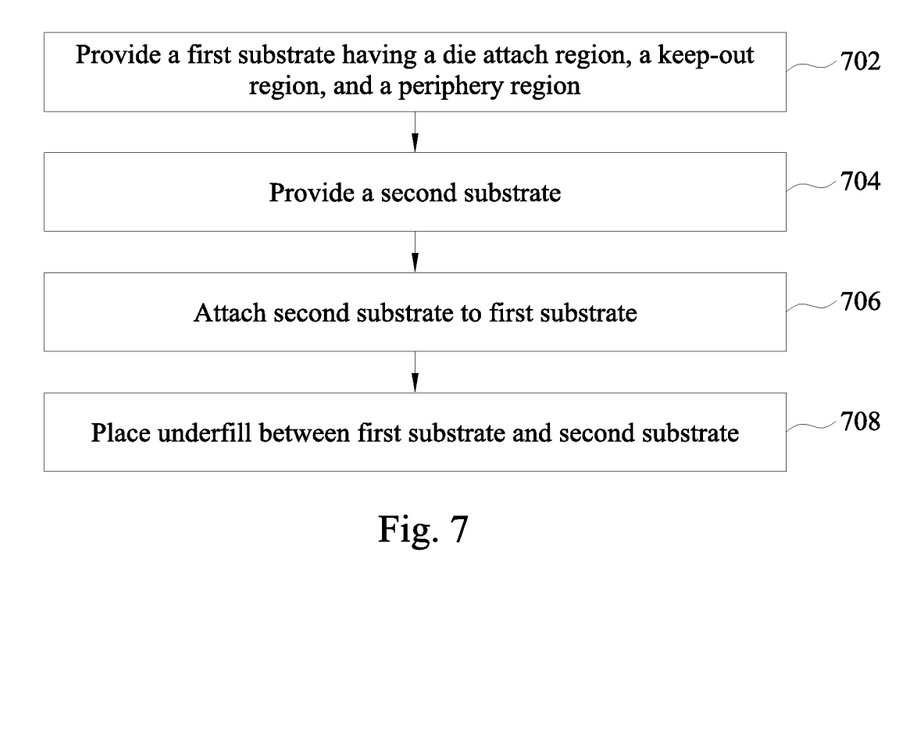
FIG. 7 is a flow diagram illustrating a method of manufacture in accordance with some embodiments.

FIG. 7 is a flow diagram illustrating a process of manufacture in accordance with some embodiments. The process begins in step 702, wherein a first substrate is provided, such that the first substrate includes a die attach region, a keep-out region, and a periphery region, wherein a protective layer protects traces in the periphery region, such as that discussed above with reference to FIGS. 4A and 4B. In step 704, a second substrate is provided and in step 706 the second substrate is attached to the first substrate, such as that discussed above with reference to FIGS. 5A and 5B. The first substrate is attached to the second substrate in a manner to provide a KOR region and a keep-out distance between the first substrate and a closest edge of the protective layer. In step 708, an underfill is placed between the first substrate and the second substrate. Maintaining a KOR and a keep-out distance as discussed above allows the underfill to be placed with little or no voids while providing protection to traces within the KOR.

In an embodiment, a device is provided. The device includes a first substrate having traces formed thereon. The first substrate has a die attach region, a keep-out region around a periphery of the die attach region, and a periphery region around a periphery of the keep-out region. The first substrate further includes a protective layer overlying the traces in the periphery region. A second substrate is electrically coupled to the first substrate in the die attach region, and an underfill is interposed between the first substrate and the second substrate, the underfill extending over the traces located in the keep-out region, wherein an area of the keep-out region is between about 5% and about 18% of an area of the second substrate.

In another embodiment, a device is provided. The device includes a first substrate having a die attach region, a periphery region, and a keep-out region interposed between the die attach region and the periphery region, wherein a protective layer covers traces in the periphery region and wherein the protective layer does not extend into the die attach region and the keep-out region. A second substrate is electrically coupled to the first substrate such that the second substrate is located over the die attach region of the first substrate. The die attach region corresponds to a region of the first substrate directly under the second substrate, and the keep-out region extends from a boundary of the protective layer to a boundary of the die attach region. An area of the keep-out region is between about 5% and about 18% of an area of the second substrate.

In yet another embodiment, a method of forming a semiconductor device is provided. The method includes providing a first substrate having traces formed thereon, and forming a protective layer over a portion of the first substrate. A second substrate is attached to the first substrate. A keep-out region extends between a boundary of the protective layer and a periphery of the second substrate, wherein an area of the keep-out region is between about 5% and about 18% of an area of the second substrate.

In yet another embodiment, a method of forming a semiconductor device is provided. The method includes attaching a first substrate to a die attach region of a second substrate, the second substrate having traces formed thereon, the second substrate having a keep-out region around a periphery of the die attach region, and a periphery region around a periphery of the keep-out region, the second substrate having a protective layer overlying the traces in the periphery region, an area of the keep-out region being between about 5% and about 18% of an area of the first substrate. The method also includes forming an underfill interposed between the first substrate and the second substrate, the underfill extending over the traces located in the keep-out region.

In yet another embodiment, a method of forming a semiconductor device is provided. The method includes forming a protective layer over traces in a periphery region of a first substrate, the first substrate having a die attach region, a keep-out region around a periphery of the die attach region, the periphery region extending around the keep-out region, at least a first trace of the traces extending from the protective layer to the die attach region. The method further includes attaching a second substrate to the die attach region of the first substrate, wherein an area of the keep-out region being between about 5% and about 18% of an area of the second substrate.

In yet another embodiment, a method of forming a semiconductor device is provided. The method includes forming a first substrate, the first substrate having traces extending from a die attach region to a periphery region, the first substrate having a keep-out region extending between the die attach region and the periphery region, and forming a protective layer over traces in a periphery region of a first substrate, traces in the keep-out region being free of the protective layer. A second substrate is attached to the die attach region of the first substrate, an area between an edge of the second substrate to an edge of the protective layer being between about 5% and about 18% of an area of the second substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    attaching a first substrate to a die attach region of a second substrate, the second substrate having traces formed thereon, the second substrate having a keep-out region around a periphery of the die attach region, and a periphery region around a periphery of the keep-out region, the second substrate having a protective layer overlying the traces in the periphery region, an area of the keep-out region being between about 5% and about 18% of an area of the first substrate, wherein the protective layer has linear sides adjacent the keep-out region, the linear sides intersecting to form a corner; and
    forming an underfill interposed between the first substrate and the second substrate, the underfill extending over the traces located in the keep-out region.

2. The method of claim 1, wherein the underfill completely covers the traces in the keep-out region and the die attach region.

3. The method of claim 1, wherein the first substrate is attach to the first substrate using a bump-on-trace connection.

4. The method of claim 1, wherein the first substrate includes a copper pillar directly coupled to a first trace on the second substrate using a solder material.

5. The method of claim 1, wherein the underfill does not extend over an upper surface of the protective layer.

6. The method of claim 1, wherein a keep-out distance between an edge of the first substrate and a closest edge of the protective layer is equal to or greater than about 420 µm.

7. A method of forming a semiconductor device, the method comprising:
    forming a protective layer over traces in a periphery region of a first substrate, the first substrate having a die attach region, a keep-out region around a periphery of the die attach region, the periphery region extending around the keep-out region, at least a first trace of the traces extending from the protective layer to the die attach region; and
    attaching a second substrate to the die attach region of the first substrate;
    wherein an area of the keep-out region being between about 5% and about 18% of an area of the second substrate.

8. The method of claim 7, further comprising placing an underfill between the first substrate and the second substrate.

9. The method of claim 8, wherein the underfill completely covers the traces in the keep-out region.

10. The method of claim 9, wherein the underfill comprises a polymer compound with silicon dioxide filler material.

11. The method of claim 9, wherein the underfill does not extend over an upper surface of the protective layer.

12. The method of claim 7, wherein the second substrate comprises an integrated circuit die.

13. The method of claim 7, wherein a keep-out distance between an edge of the first substrate and a closest edge of the protective layer is equal to or greater than about 420 µm.

14. A method of forming a semiconductor device, the method comprising:
    forming a first substrate, the first substrate having traces extending from a die attach region to a periphery region, the first substrate having a keep-out region extending between the die attach region and the periphery region;
    forming a protective layer over traces in a periphery region of the first substrate, traces in the keep-out region being free of the protective layer; and
    attaching a second substrate to the die attach region of the first substrate, an area between an edge of the second substrate to an edge of the protective layer being between about 5% and about 18% of an area of the second substrate.

15. The method of claim 14, further comprising forming an underfill interposed between the first substrate and the second substrate, the underfill extending over the traces located in the keep-out region.

16. The method of claim 15, wherein the underfill completely covers the traces in the keep-out region.

17. The method of claim 15, wherein an upper surface of the protective layer is free of the underfill.

18. The method of claim 15, wherein the underfill completely covers the traces in the keep-out region and the die attach region.

19. The method of claim 14, wherein a keep-out distance between an edge of the first substrate and a closest edge of the protective layer is equal to or greater than about 420 μm.

20. The method of claim 1, wherein the underfill extends along a sidewall of the first substrate.

* * * * *